United States Patent [19]

Waldner

[11] Patent Number: 5,643,699

[45] Date of Patent: Jul. 1, 1997

[54] METHOD AND DEVICE FOR THE MUTUAL ALIGNMENT OF A FILM AND A PRINTED CIRCUIT BOARD

[76] Inventor: Paul R. Waldner, Pestalozzistrasse 12, 61350 Bad Homburg, Germany

[21] Appl. No.: 438,929

[22] Filed: May 10, 1995

[30] Foreign Application Priority Data

May 13, 1994 [DE] Germany .................. 44 16 882.9

[51] Int. Cl.⁶ .................................................. G03F 9/00
[52] U.S. Cl. ................. 430/22; 430/30; 430/311; 101/481; 101/485; 428/901
[58] Field of Search ................ 430/22, 30, 311; 101/481, 485; 428/901, 209

[56] References Cited

U.S. PATENT DOCUMENTS 5,388,517  2/1995  Levien ................................. 101/485

*Primary Examiner*—S. Rosasco
*Attorney, Agent, or Firm*—Larson and Taylor

[57] ABSTRACT

A method and apparatus are provided for the mutual alignment of a film and a printed circuit board prior to printing of the printed circuit board. At least two cameras are used to optically register the respective position of a marker on the film in relation to a respectively associated reference marker on the printed circuit board. In the event of a deviation or deviations from a set position, the relative position of the printed circuit board to the film is corrected within a tolerance range. At least two markers and associated reference markers are registered simultaneously with at least one camera. Preferably, the markers and the associated reference markers are each respectively arranged in squares of groups of nine and each of the groups is registered by one camera.

9 Claims, 1 Drawing Sheet

METHOD AND DEVICE FOR THE MUTUAL ALIGNMENT OF A FILM AND A PRINTED CIRCUIT BOARD

FIELD OF THE INVENTION

The invention relates to a method for the mutual alignment of a film and a printed circuit board prior to the latter being printed, wherein at least two cameras optically register the respective position of a marker on the film in relation to a respectively associated reference marker on the printed circuit board and wherein in case of deviations from a set position the relative position of the printed circuit board to the film is corrected within a tolerance range. The invention also relates to a device for executing this method.

BACKGROUND OF THE INVENTION

In order to optimally align a film with the printed circuit board image prior to its being printed in the course of producing printed circuit boards, the film is provided in the simplest case with two marker points on opposite sides and two additional holes as reference markers are drilled during drilling of the printed circuit boards, which is required in any event. Two cameras register respectively one marker with the associated reference marker, wherein the printed circuit board can be displaced in relation to the film by an electronically controlled device for bringing the markers and the associated reference markers into exact congruence. However, the exactness of such a system not only depends on the image resolution and the exactness of the displacement device. Inexactness in preparing the drilled holes unfortunately also leads to improper alignment of the printed circuit board in relation to the film, since the board is aligned in accordance with the incorrect position of the reference markers.

A method had been proposed to compensate for such statistical errors, wherein each one of the two cameras is respectively displaced sequentially along an axis to various markers and associated reference markers. The cameras register the relative positions of the markers and reference markers, forward the information to a computer which calculates the optimal position and the displacement device moves the printed circuit board accordingly in relation to the film.

The disadvantage in this method is that the cameras need to be guided with utmost precision in order not to distort the alignment results. Furthermore, the amount of required time is increased because of having to move along the marker pairs.

OBJECT AND SUMMARY OF THE INVENTION

It is the object of the invention to improve a method of the above mentioned type in such a way that the statistical errors which occur during application of the markers and reference markers to the film or the printed circuit board are compensated for in a simple manner.

This object is attained in accordance with the invention by provision of a method wherein using at least one of the cameras, at least two markers and associated reference markers are registered simultaneously.

The advantage of the method lies in that with an increase in the numbers of registered markers and associated reference markers the statistical errors in the positions of individual markers can be better compensated for without requiring movable cameras for this purpose.

In a preferred embodiment of the method it is provided that the markers and associated reference markers are arranged in groups of nine in squares and that each camera registers one such group.

With this arrangement, on the one hand, the space required for the markers on the film and the printed circuit board is small and, on the other, a sufficient statistical certainty is assured because of the total of eighteen pairs of markers which can be evaluated.

The markers on the film advantageously are points which are respectively matched with the centers of drill holes in the printed circuit board.

A further aspect of the invention concerns the provision of a device for executing the above method. The device comprises at least two cameras which optically register the respective position of a marker on the film in relation to a respectively associated reference marker on the printed circuit board, and a displacement device which, in case of deviations from a set position, corrects the position of the printed circuit board in relation to the film within a tolerance range, wherein in accordance with the invention at least one of the cameras simultaneously registers at least two markers and associated reference markers.

The invention will be explained in detail below by means of an exemplary embodiment represented in the drawings.

DETAILED DESCRIPTION OF THE PREFERRED EMBODIMENT

Figure 1:
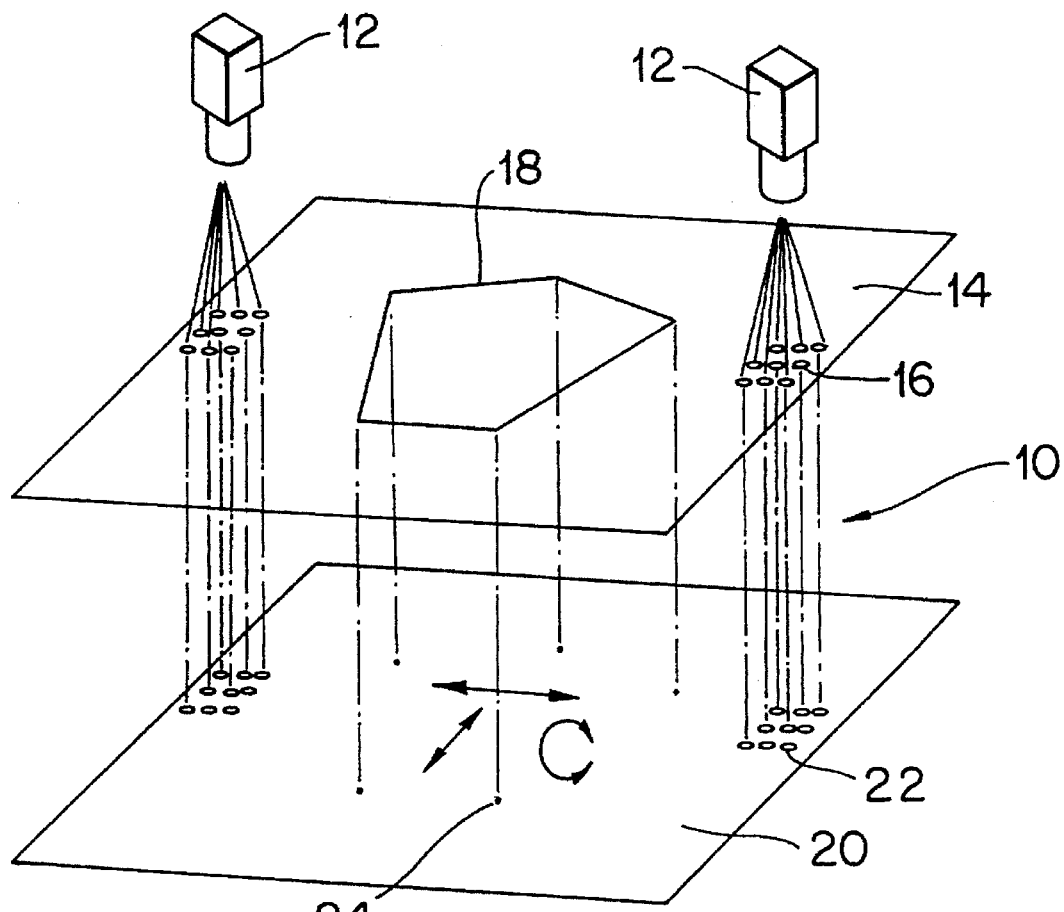
FIG. 1 is a schematic perspective view of a device in accordance with a preferred embodiment of the invention.

As shown in FIG. 1, a device generally denoted 10 is provided which includes two fixedly disposed cameras 12 and a film 14, which can be fixed in place in relation to cameras 12. The film 14 is provided with markers 16, which are positioned in the shape of two groups of nine disposed in squares in the field of view of a camera. A printed circuit board image 18 is furthermore formed on the film 14 which takes up or is disposed at an exactly defined position in relation to the markers 16.

A printed circuit board 20 can be displaced and turned in a plane parallel to the film 14 by means of a displacement device (not shown). The printed circuit board 20 is provided with marker bores 22, whose position in respect to each other corresponds to the position of the markers 16 on the film 14 in respect to each other. Conductor bores 24 in the printed circuit board 20 have exactly defined distances in relation to the marker bores 22.

Figure 2:
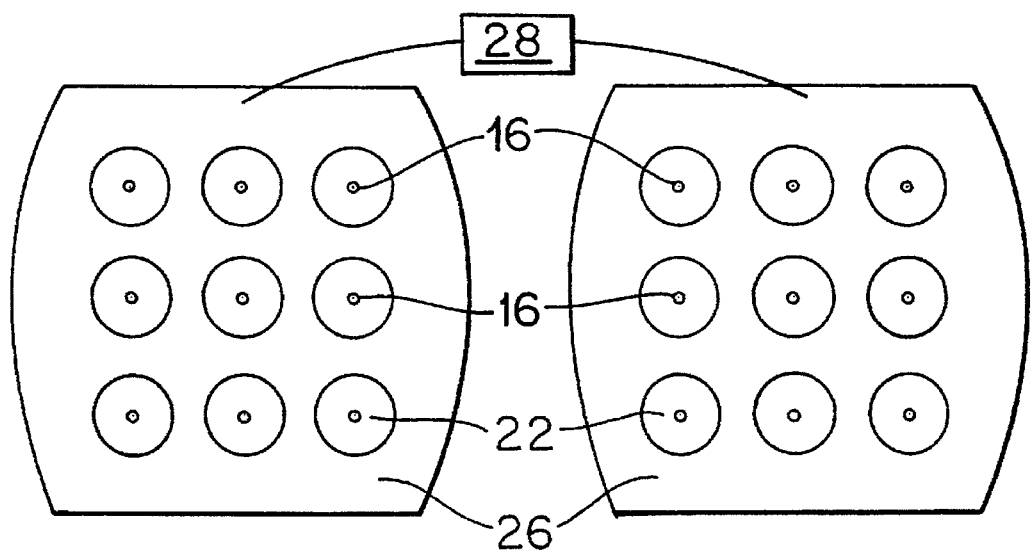
FIG. 2 is a top plane view showing the two squarely arranged groups of nine markers of FIG. 1.

In the process of the invention, the printed circuit board 20 is first oriented in such a way that the marker bores 22 are roughly aligned with the markers 16. In the course of this operation, thanks to the transparent film 14, the cameras 12 register the position of the individual markers in relation to the marker bores 22. As indicated in FIG. 2, the image information 26 of the two cameras 12 is evaluated by a computer 28. Computer 28 calculates an optimal displacement position of the printed circuit board 20 wherein as many markers 16 as possible come to lie as closely as possible to the centers of the associated marker bores 22. In other words, a compromise alignment between the markers and bores is determined which provides optimized compensation for the deviations of the positions of the individual bores from a set or ideal position. Now the displacement device (not shown) is triggered by the computer 28 in such a way that the printed circuit board 20 is optimally aligned with the film 14. In the same way, it is possible to fix the printed circuit board 20 in place in relation to the two cameras 12 and to displace the film 14, controlled accordingly by the computer 28, in relation to the printed circuit board 20.

Both variants permit the compensation of statistical errors occurring in the preparation of the marker bores 22 in a very simple manner and in that way to achieve a more exact position of the printed circuit board image 18 in relation to the printed circuit board bores 24.

What is claimed is:

1. A method for the mutual alignment of a film and a printed circuit board prior to printing of the printed circuit board, said method comprising a registering step comprising using at least two cameras to optically register the respective positions of a plurality of markers on the film in relation to a plurality of respectively associated reference bores in the printed circuit board and a correcting step comprising, in the event of deviations of individual bores of different amounts and in different directions from an ideal position, correcting the relative position of the printed circuit board with respect to the film within a tolerance range so as to provide optimized compensation for said deviations of different amounts and in different directions of the positions of said individual bores, said registering step comprising registering at least two markers and associated reference bores simultaneously with at least one camera so that by aligning as many as possible of said at least two markers as closely as possible with said associated reference bores, said optimized compensation for said deviations of different amounts and in different directions of the positions of said individual bores is provided.

2. A method in accordance with claim 1, wherein the bores and the associated reference markers are each respectively arranged in squares of groups of nine and each one of said groups is registered by one camera.

3. A method in accordance with claim 1, wherein the film marker is matched with the center of a references bore in the printed circuit board.

4. A method in accordance with claim 1, wherein the camera is fixed in place in respect to the film and the printed circuit board is displaced.

5. A method in accordance with claim 1, wherein the camera is fixed in place in respect to the printed circuit board and the film is displaced.

6. A device for providing mutual alignment of a film and a printed circuit board prior to printing of the printed circuit board, said device comprising at least two cameras which optically register the respective positions of a plurality of markers on the film in relation to a plurality of respectively associated reference bores in the printed circuit board, and a displacement means, responsive to the occurrence of deviations of different amounts and in different directions of individual bores from an ideal position, correcting the position of the printed circuit board in relation to the film within a tolerance range so as to provide optimized compensation for said deviations of different amounts and in different directions of the positions of said individual bores, at least one of the cameras simultaneously registering at least two markers and associated reference bores so that by providing a compromise alignment wherein as many as possible of said at least two markers are aligned as closely as possible with respect to said associated reference bores said optimized compensation for said different amounts and in different directions of said individual bores is provided.

7. A device in accordance with claim 6, wherein the cameras are fixed in place in relation to the film and the displacement means acts on the printed circuit board.

8. A device in accordance with claim 6, wherein the cameras are disposed fixed in place in relation to the printed circuit board and the displacement means acts on the film.

9. A device in accordance with claim 6, wherein said displacement means includes computer means operatively coupled to said at least one camera for determining the optimal relative position of said printed circuit board with respect to said film based on image information received from said at least one camera when said at least one camera simultaneously registers said at least two markers and associated reference bores.

* * * * *